United States Patent [19]

Thompson

[11] 4,236,230

[45] Nov. 25, 1980

[54] BISTABLE MAGNETOSTRICTIVE DEVICE

[75] Inventor: David A. Thompson, South Salem, N.Y.

[73] Assignee: International Business Machines Corporation, Armonk, N.Y.

[21] Appl. No.: 862,250

[22] Filed: Dec. 19, 1977

[51] Int. Cl.³ .............................................. G11C 11/12
[52] U.S. Cl. .................................... 365/157; 365/133; 365/136; 148/108; 148/120; 148/21; 427/47; 427/132
[58] Field of Search ................ 365/133, 136, 137, 139, 365/157; 148/108, 120, 121; 427/47, 132

[56] References Cited

U.S. PATENT DOCUMENTS

| | | | |
|---|---|---|---|
| 3,270,326 | 8/1966 | Schwartz et al. | 365/56 |
| 3,320,596 | 5/1967 | Smith, Jr. et al. | 365/136 |
| 3,820,090 | 6/1974 | Wiegand | 365/133 |
| 4,065,757 | 12/1977 | Kardashian | 365/157 |

FOREIGN PATENT DOCUMENTS 47-26220 7/1972 Japan ........................................ 365/133

Primary Examiner—James W. Moffitt
Attorney, Agent, or Firm—Graham S. Jones, II

[57] ABSTRACT

A device includes a core, such as a wire or cylinder of a solid material such as nonmagnetic metal, coated with a film of a material having a high degree of magnetostriction and a uniaxial helical magnetic anisotropy at an oblique angle to the longitudinal axis of the core. The device has the characteristic of being magnetically bistable and of providing a large magnetic pulse as it changes to one of its stable states in response to passage of a magnetic field by it. To achieve a helical magnetic anisotropy, the magnetostrictive film can be applied to a nonmagnetic wire by plating the wire while it is under torsion, twisting a plated wire after plating, or by applying an electric current and a magnetic field to the wire as the film is being plated or annealed.

18 Claims, 7 Drawing Figures

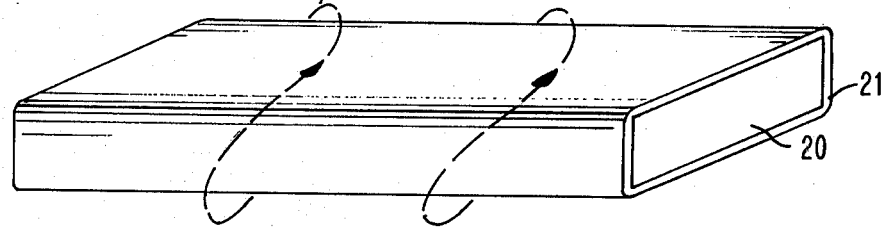
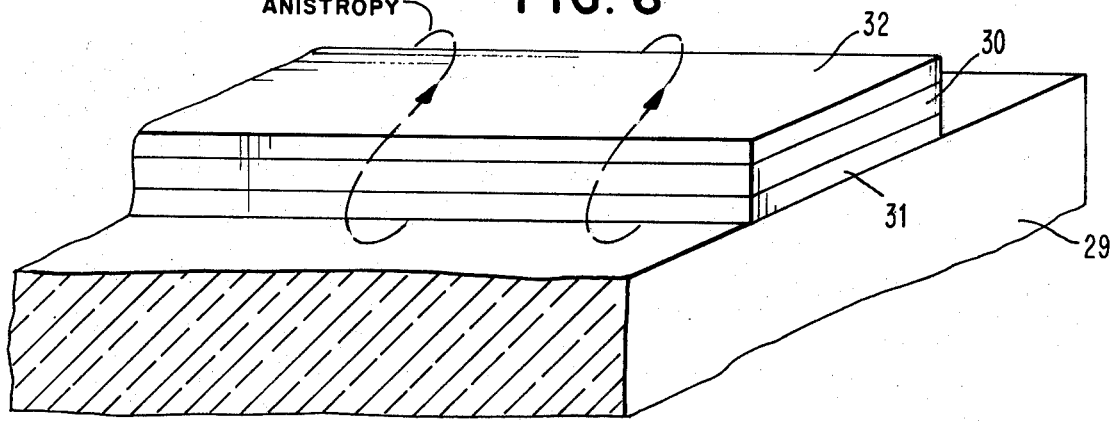
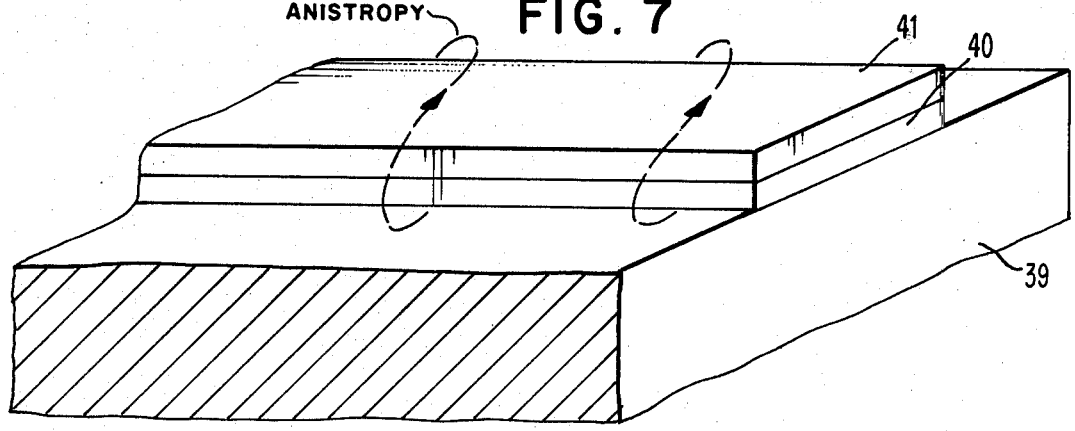

BISTABLE MAGNETOSTRICTIVE DEVICE

BACKGROUND OF THE INVENTION

1. Field of the Invention

This invention relates to magnetostrictive wires having uniaxial magnetic anisotropy and to methods of manufacture thereof.

2. Description of the Prior Art

U.S. Pat. No. 3,820,090 of Wiegand describes a bistable ferromagnetic wire of generally uniform composition having a central magnetically soft core and a magnetically hard outer shell portion of substantially the same chemical composition. The wire is made by starting with 48:52 Fe:Ni alloy wire, stretching 2½% and then circumferentially straining the wire as by twisting the wire back and forth with or without retaining a permanent twist.

U.S. Pat. No. 3,217,301 of Shook describes a process of stretching a segment of a wire along its length by suspending a heavy weight from it while electroplating the wire with a ferromagnetic nickel coating with negative magnetostriction (i.e., which is increased by compression following plating upon release of the weight causing the stretching). The substrate is composed of a conductive metal such as an alloy of Cu, Al, brass, or bronze. Sonic pulses are generated by a read coil on the unstressed end of the wire, because of its sensitive magnetostrictive properties, for propagating a sonic stress wave through the memory element. Sections of the stressed magnetostrictive coating are used to store bianary data, and helical "sense coils" along the element sense nondestructively the data in response to such an acoustic wave. Domains are written by means of helical "write coils."

U.S. Pat. Nos. 3,129,412 of Lovell and 3,145,372 of Suits et al teach provision of a rectangular thin film delay line structure with a thin NiFe (85:15 or 75:25) magnetostrictive film having a transverse magnetic anisotropy (easy axis). Acoustic waves are generated at one end of the substrate and data is introduced at one end of the strip. The magnetostrictive effects caused by the acoustic wave acting on the thin film generates a phased delay along the delay line. No suggestion of prestressing of the substrate is involved, nor is any spiral or twisting involved.

U.S. Pat. No. 3,492,667 of Gratian describes a magnetic memory element with a hollow tube of magnetostrictive material such as 60:40-NiFe which transmits acoustic waves for reading or writing data.

U.S. Pat. No. 3,534,340 of Murray et al shows in FIG. 10 a magnetostrictive rod 100, having a traveling domain wall, juxtaposed axially with a sheet of magnetic storage medium 104 magnetized transversely. However, there is no prestressing of the rod 100, nor is a large pulse provided by the rod.

U.S. Pat. No. 3,548,390 of Furuoya for a semi-permanent memory device describes a wire having a core of a soft film coated by a hard film. It was intended to replace a twistor wire, with circumferential magnetization, plus another NiFe soft films.

U.S. Pat. No. 3,370,979 of Schmeckenbecher teaches provision of a structure with a cylindrical Permalloy storage layer 11 of Ni-Fe-P on a glass substrate 17, coated with an outer biasing layer 13 of Ni-Co-Fe-P.

Bartkus et al U.S. Pat. No. 3,134,096 in FIG. 5 shows a hollow cylinder with an inner core 10 of 6.0 CrO, 54.0 MnO, 40.0 Fe$_2$O$_3$ and 0.9 Br/Bs as described in U.S. Pat. No. 2,950,252, with an outer layer 34 of high coercivity material.

Matsushita U.S. Pat. No. 3,451,793 teaches an inner cylindrical conductive core, coated with a layer of NiFe (50:50) covered by a layer of NiFe (79:21).

None of the above prior art suggests providing a diagonal angle of magnetic anisotropy relative to the axis of a cylindrical or flat substrate where plating is involved. This is a crowded art and the teaching of Wiegand U.S. Pat. No. 3,820,090 leads away from this disclosure because it teaches stretching and repeated twisting back and forth of a material, thereby yielding work hardening and magnetic hardening, but requires that there be only one material included. It also requires that the core be of the same magnetic material as the outer shell of the wire. With this invention, devices can be made without any mechanical stress being employed to impart a helical anisotropy to a magnetostrictive element.

SUMMARY OF THE INVENTION

In accordance with this invention, an elongated bistable magnetostrictive device includes a core composed of a solid material, and a thin film coating on the exterior of the solid material having a high degree of magnetostriction. The coating has a uniaxial magnetic anisotropy at substantially a 45° angle relative to the longitudinal axis of the core. Preferably, the uniaxial magnetic anisotropy forms a helical shape about the circumference of the core within the thin film coating and about the longitudinal axis of the elongated device.

Further in accordance with this invention, the core belongs to the class including wires, ribbons, thin film stripes and fibers including glass fibers, and the thin film coating has at its surface a magnetic anisotropy at substantially a 45° angle relative to a line parallel to the longitudinal axis of the wire, which is achieved by a technique selected from twisting the wire after deposition, releasing torsional strain after deposition, and applying a helical magnetic field to the film having the axis of the helix directed along the axis of said core for imposing said magnetic anisotropy during deposition of the film or subsequent annealing.

In still another aspect of the invention, the core is a hollow tubular structure.

In another aspect of the invention, an elongated unitary magnetic device has first and second portions having dissimilar chemical compositions. At least the first portion is magnetostrictive and is capable of retaining net magnetization after being subjected to a magnetic field. The net coercivity of the first portion is substantially greater than the net coercivity of the second portion. The first and second portions are separated along an interface of different composition providing a magnetic domain interface when the first portion has a net magnetization in a first direction and the second portion has a net magnetization substantially opposite from the first direction. The first portion has a magnetic anisotropy at an oblique angle to the overall length of the elongated device.

In accordance with this invention, a method of manufacture of a bistable magnetostrictive device is provided which comprises depositing a film of a magnetostrictive material upon an elongated core of a different material having a substantially different chemical composition, and applying a helical magnetic uniaxial anisotropy to the magnetostrictive material.

Further in accordance with this invention, a method is provided for applying helical anisotropy concurrently with deposition of the film by means of applying a helical magnetic field along the longitudinal axis of the core. Moreover, the helical field can be applied by the method of directing an external magnetic field along the axis of the core concurrently with an annular circumferential field which is applied by providing an electrical current through the core. Additionally in accordance with this invention, a film is electroplated onto the core while a current passes through the core.

Further, a method is provided for applying helical anisotropy by means of mechanical force.

In accordance with this invention, mechanical force can be applied by a force causing twisting of the ends of the core prior to coating and then releasing the force which had been causing twisting, yielding a mechanically induced helical magnetostriction. Also in accordance with this invention an alternative method of employing such mechanical force stretches the core, preferably below its elastic limit, and concurrently twists it beyond its elastic limit to yield helical magnetostriction.

The instant invention is different from all of the prior art in that it achieves a bistable form of magnetic structure composed of a pair of layers of dissimilar materials which switch, yielding a large magnetic pulse. In addition, a novel process of manufacturing bistable magnetic elements and wire is provided which is substantially different from the technique of work hardening of an outer shell by twisting repeatedly under tension in U.S. Pat. No. 3,820,090, insofar as the outer layer is applied while the inner layer is under tension or the outer layer is deposited while the inner layer is resting in a magnetic field directed at an oblique angle to the structure.

BRIEF DESCRIPTION OF THE DRAWINGS

FIG. 5 shows a wire ribbon coated with a layer of magnetostrictive material.

FIG. 6 shows a set of thin film deposits of material with a coated core sandwiched with thin magnetostrictive films above and below.

FIG. 7 shows a set of thin film deposits of material as in FIG. 6 with a thin magnetostrictive film above the core and on a magnetic substrate.

DESCRIPTION OF THE PREFERRED EMBODIMENT

Figure 1:
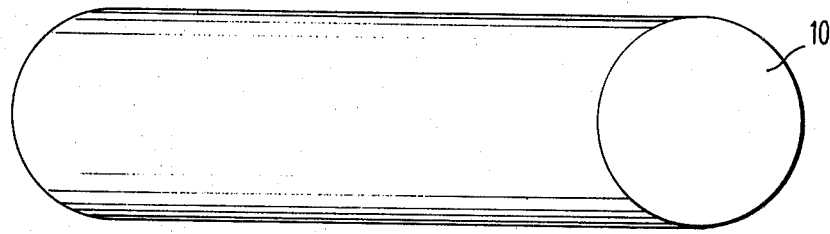
FIG. 1 shows a segment of a wire adapted for providing a core of a bistable magnetic element.

FIG. 1 shows a core 10 of a short length of a solid material such as a commercial spring grade beryllium copper (other materials include tungsten, molybdenum, nichrome, nonmagnetic stainless steel, soft magnetic materials such as Ni:Fe 80:2, commercial Si:Fe [3–12% Si], etc.) wire about 0.002–0.020 inch thick with a cylindrical shape, although the core can have many shapes including elliptical shapes and ribbons.

Figure 2:
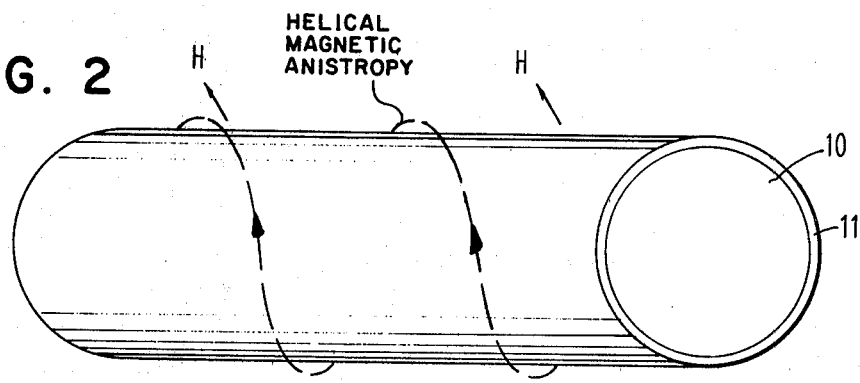
FIG. 2 shows the wire of FIG. 1 coated with a thin film of magnetostrictive material.

FIG. 2 shows the wire core 10 of FIG. 1 coated with a thin film 11 of a magnetostrictive coating of a metallic material such as about 50:50 NiFe or about 50:50 FeCo having a thickness of about 2 to 20 micrometers and deposited by techniques such as electroplating, vacuum deposition, evaporation in an ultra-high vacuum, ion plating, sputtering, or the like in the presence of a magnetic field from a permanent magnet disposed at an angle to provide an external magnetic field aligned with the longitudinal axis of the cylindrical shape of the wire core 10, plus an electrical current through the wire core 10 (when the core is electrically conductive) which produces an annular magnetic field about the wire 10 and film 11. The two magnetic fields combine in order to create a helical magnetic field about the core 10 so that at every point on the surface of the core 10 the magnetic field applied is at substantially 45° to a line parallel to that longitudinal axis. If the above technique of using an external magnetic field and current are not applied to the film 11 as it is being deposited, the core can be twisted about its longitudinal axis in a suitable jig adapted to grasp both ends of a core 10 held under a longitudinal tension well below the elastic limit and with twisting turns of the core 10 on its longitudinal axis approaching the elastic limit while it is being coated with the magnetostrictive coating 11. As a third alternative, the plated wire core 10 of FIG. 2 which has been applied without inducing a helical magnetic anisotropy can be placed under tension and twisted about its longitudinal axis in excess of the elastic limit until it is sufficiently work hardened to possess a helical magnetic anisotropy.

Electroplating of wire with a current provided through the wire plus an external magnetic field to establish helical magnetic anisotropy is achieved by placing a current of several Amperes D.C. or switched in polarity in synchronism with the external field across a wire while it is resting in an electroplating bath. Uniform plating is achieved from one end to the other of the wire because the voltage drop due to this current is small compared to the several volts of the electroplating process. Thickness variation along the wire may be held below 10% because the voltage drop due to the bias current is small compared to the plating voltage. The thickness variation is zero in a continuous plating cell in which the wire passes sequentially through the cell during plating.

When the core 10 is composed of soft magnetic material, its coercivity is far less than that of film 11. The net magnetization in the core 10 is in the opposite direction from film 11 in the largest energy state, i.e., in the absence of an external magnetic field.

Figure 3:
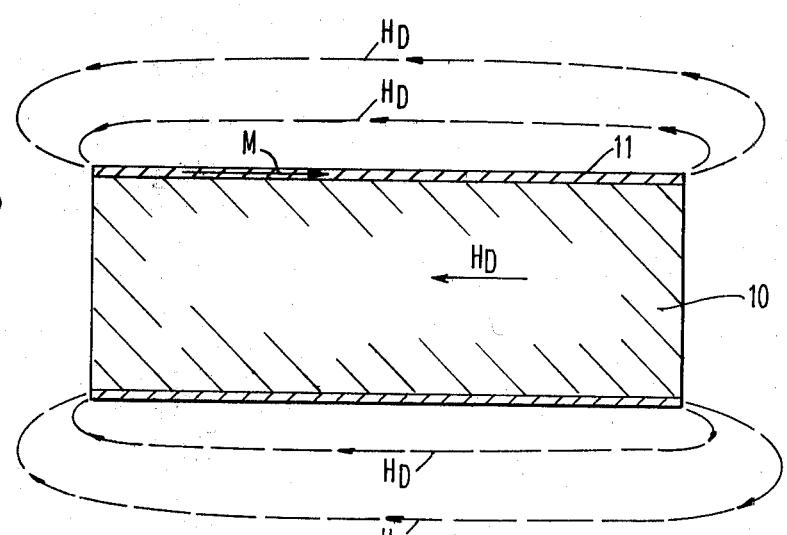
FIG. 3 shows the structure of FIG. 2 in a longitudinal cross-section illustrating the magnetization field as well as the demagnetization field within the structure.

FIG. 3 shows the magnetic fields within and about a cross-section of a plated wire core in FIG. 2. The magnetization field M is shown directed through the film 11 to the right, and the demagnetization field $H_D$ is shown directed from right to left.

Figure 4:
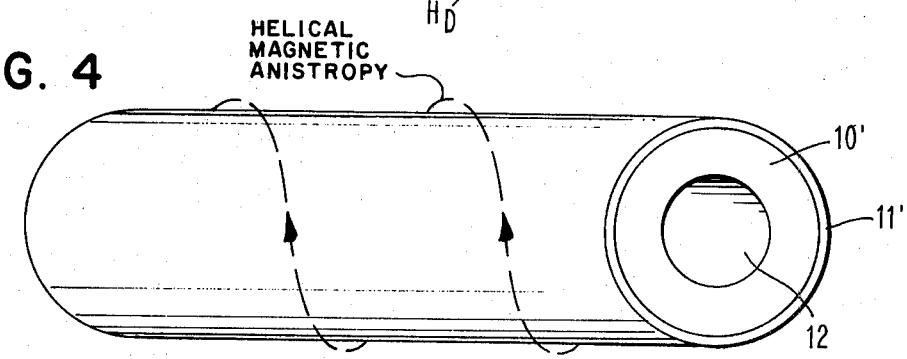
FIG. 4 shows a structure similar to that of FIG. 2 with a hollow core.

FIG. 4 shows a hollow core 10' which is coated with magnetostrictive film 11' as above. Hollow core 12 can be formed by plating core 10' on a wire or fiber and then etching away the wire or fiber.

Another alternative embodiment of the invention is shown in FIG. 5 in which a ribbon of wire serves as a core 20, with a coating 21 composed of magnetostrictive material. Techniques of manufacture include vacuum deposition, etc. or plating or annealing magnetostrictive layer 21 while current is passed through core 21 with a longitudinal external magnetic field, and stretching while coating. Thus, a helical magnetic anisotropy exists about the ribbon core 20. The circumference is about the same for a ribbon as for a wire, where 10 mils for a wire diameter is equivalent to 15 mils for a ribbon.

FIG. 6 shows a thin film structure in accordance with this invention. A lower layer of magnetostrictive film is deposited on substrate 29 in an external magnetic field to form a stripe 31. Then a thin film stripe 30 of a core material composed of materials such as core 10 is deposited upon stripe 31. Subsequently, a thin film stripe 32 of magnetostrictive film is deposited upon stripe 30 in a magnetic field at right angles to the first magnetic field, but having a component along stripe 30 in the same direction, whereby a helical magnetic anisotropy is provided about core 30 along the stripe.

A thin film strip of a core material 40 is shown in FIG. 7 deposited on a magnetically soft substrate 39 such as a ferrite. A thin film of magnetostrictive material 41 is deposited upon core 40 in a diagonal magnetic field creating a magnetic anisotropy about core 40 in the magnetostrictive material 41. Alternatively, the film may be deposited in sheet form, and the composite is etched into a stripe in a single operation. The anisotropy can be obtained by subsequent annealing in a magnetic field with current passing through the stripe, as above.

Wires and films such as these are useful for keyboard technologies, card readers, counting objects or numbers, etc.

The device has the characteristic of being magnetically bistable and it produces large magnetic field pulses (which can be detected by a magnetic field sensor coil) as it changes from one of its stable states to the other in response to application of an opposed magnetic field to it.

A device in accordance with this invention must contain a magnetostrictive region. When the magnetization is reversed by application of a magnetic field, the sum of applied fields and biases at the threshold for switching may cause a substantial difference in magnetostrictive strain between the switched and unswitched regions, enhancing the speed of switching.

What is claimed is:
1. An elongated unitary magnetic device comprising first and second portions having dissimilar chemical compositions,
at least said first portion being magnetostrictive and being capable of retaining net magnetization after being subjected to a magnetic field,
the net coercivity of said first portion being substantially greater than the net coercivity of the second portion,
said first and said second portions being separated along an interface of different composition providing a magnetic domain interface when said first portion has a net magnetization in a first direction and said second portion has a net magnetization substantially opposite from said first direction, and
said first portion having a helical magnetic anisotropy about an axis along the overall length of said elongated device.
2. A device in accordance with claim 1 wherein said second portion comprises a wire.
3. A device in accordance with claim 1 wherein said second portion comprises a ribbon.
4. A device in accordance with claim 1 wherein said second portion comprises a thin film stripe.
5. A device in accordance with claim 1 wherein said second portion comprises a fiber.
6. An elongated magnetostrictive device in accordance with claim 1, said second portion comprising a core composed of an elongated body,
said first portion comprising a thin film coating on the exterior of said core having a high degree of magnetostriction,
said thin film coating having a uniaxial helical, magnetic anisotropy about the circumference of said core within said coating and about the longitudinal axis of said elongated device at an angle of about 45° relative to said longitudinal axis, and
said helical magnetic anisotropy having been provided by twisting said core and said coating beyond the elastic limit of said coating subsequent to deposition of said coating onto said body.
7. A device in accordance with claim 6 wherein said core comprises a hollow tubular structure.
8. An elongated magnetostrictive device in accordance with claim 1, said second portion comprising a core composed of an elongated body,
said first portion comprising a thin film coating on the exterior of said core having a high degree of magnetostriction,
said thin film coating having a uniaxial helical, magnetic anisotropy about the circumference of said core within said coating and about the longitudinal axis of said elongated device at an angle of about 45° relative to said longitudinal axis, and
said helical anisotropy having been produced by maintaining said core under torsional strain during deposition of said coating on said core and by releasing said core from torsional strain subsequent to deposition of said coating.
9. A device in accordance with claim 8 wherein said core comprises a hollow tubular structure.
10. A device in accordance with claim 8 wherein said core comprises a wire.
11. A device in accordance with claim 8 wherein said core comprises a ribbon.
12. A device in accordance with claim 8 wherein said core comprises a fiber.
13. An elongated magnetostrictive device in accordance with claim 1, said second portion comprising a core composed of an elongated body,
said first portion comprising a thin film coating on the exterior of said core having a high degree of magnetostriction,
said thin film coating having a uniaxial helical, magnetic anisotropy about the circumference of said core within said coating and about the longitudinal axis of said elongated device at an angle of about 45° relative to said longitudinal axis, and
said helical magnetic anisotropy having been produced by annealing said device in a helica magnetic field.
14. A device in accordance with claim 13 wherein said core comprises a hollow tubular structure.
15. A device in accordance with claim 13 wherein said core comprises a wire.
16. A device in accordance with claim 13 wherein said core comprises a ribbon.
17. A device in accordance with claim 13 wherein said core comprises a fiber.
18. A device in accordance with claim 13 wherein said core comprises a fiber.

* * * * *